(12) United States Patent
Hiramatsu

(10) Patent No.: US 12,230,978 B2
(45) Date of Patent: Feb. 18, 2025

(54) POWER TRANSMITTING APPARATUS, POWER RECEIVING APPARATUS, CONTROL METHODS THEREOF, AND STORAGE MEDIUM

(71) Applicant: CANON KABUSHIKI KAISHA, Tokyo (JP)

(72) Inventor: Tomoki Hiramatsu, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 175 days.

(21) Appl. No.: 17/935,384

(22) Filed: Sep. 26, 2022

(65) Prior Publication Data

US 2023/0015212 A1   Jan. 19, 2023

Related U.S. Application Data

(63) Continuation of application No. PCT/JP2021/006301, filed on Feb. 19, 2021.

(30) Foreign Application Priority Data

Mar. 31, 2020 (JP) ................ 2020-064203

(51) Int. Cl.
*H02J 50/60* (2016.01)
*H02J 50/80* (2016.01)

(52) U.S. Cl.
CPC .............. *H02J 50/60* (2016.02); *H02J 50/80* (2016.02)

(58) Field of Classification Search
CPC .................. H02J 50/60; H02J 50/80
See application file for complete search history.

(56) References Cited

U.S. PATENT DOCUMENTS

| | | | |
|---|---|---|---|
| 2014/0125287 A1 | 5/2014 | Nakano | |
| 2015/0340878 A1 | 11/2015 | Oosumi | |
| 2019/0280534 A1 | 9/2019 | Park | |
| 2019/0296590 A1* | 9/2019 | Chae | H02J 7/02 |
| 2020/0343765 A1* | 10/2020 | Kwon | H02J 50/10 |
| 2020/0373789 A1* | 11/2020 | Park | H02J 50/60 |

FOREIGN PATENT DOCUMENTS

| | | |
|---|---|---|
| CN | 105122576 A | 12/2015 |
| CN | 109450114 A | 3/2019 |
| JP | 2012135127 A | 7/2012 |

(Continued)

*Primary Examiner* — Carlos Amaya
(74) *Attorney, Agent, or Firm* — Canon U.S.A., Inc. IP Division

(57) ABSTRACT

A power transmitting apparatus measures a Q factor of a power transmitting unit that performs wireless power transfer to a power receiving apparatus, and determines presence/absence of an object different from the power receiving apparatus based on the Q factor. The power transmitting apparatus obtains a first index value regarding a predetermined physical amount different from the Q factor after measurement of the Q factor, obtains a second index value regarding the predetermined physical amount before wireless power transfer to the power receiving apparatus starts after the it is determined in the above determination that an object different from the power receiving apparatus does not exist; and determines presence/absence of an object different from the power receiving apparatus based on the first index value and the second index value.

10 Claims, 11 Drawing Sheets

(56) References Cited

FOREIGN PATENT DOCUMENTS

| | | |
|---|---|---|
| JP | 5071574 B1 | 11/2012 |
| JP | 2013027255 A | 2/2013 |
| JP | 2013132133 A | 7/2013 |
| JP | 2013135518 A | 7/2013 |
| JP | 2016007116 A | 1/2016 |
| JP | 2016096724 A | 5/2016 |
| JP | 2017034972 A | 2/2017 |
| JP | 2017070074 A | 4/2017 |
| JP | 2018113849 A | 7/2018 |
| JP | 2018129942 A | 8/2018 |
| JP | 2018133993 A | 8/2018 |
| JP | 2019097383 A | 6/2019 |
| KR | 20180027104 A | 3/2018 |
| KR | 20200023522 A | 3/2020 |
| WO | 2014155519 A1 | 10/2014 |
| WO | 2019/088760 A1 | 5/2019 |
| WO | 2020050507 A1 | 3/2020 |

\* cited by examiner

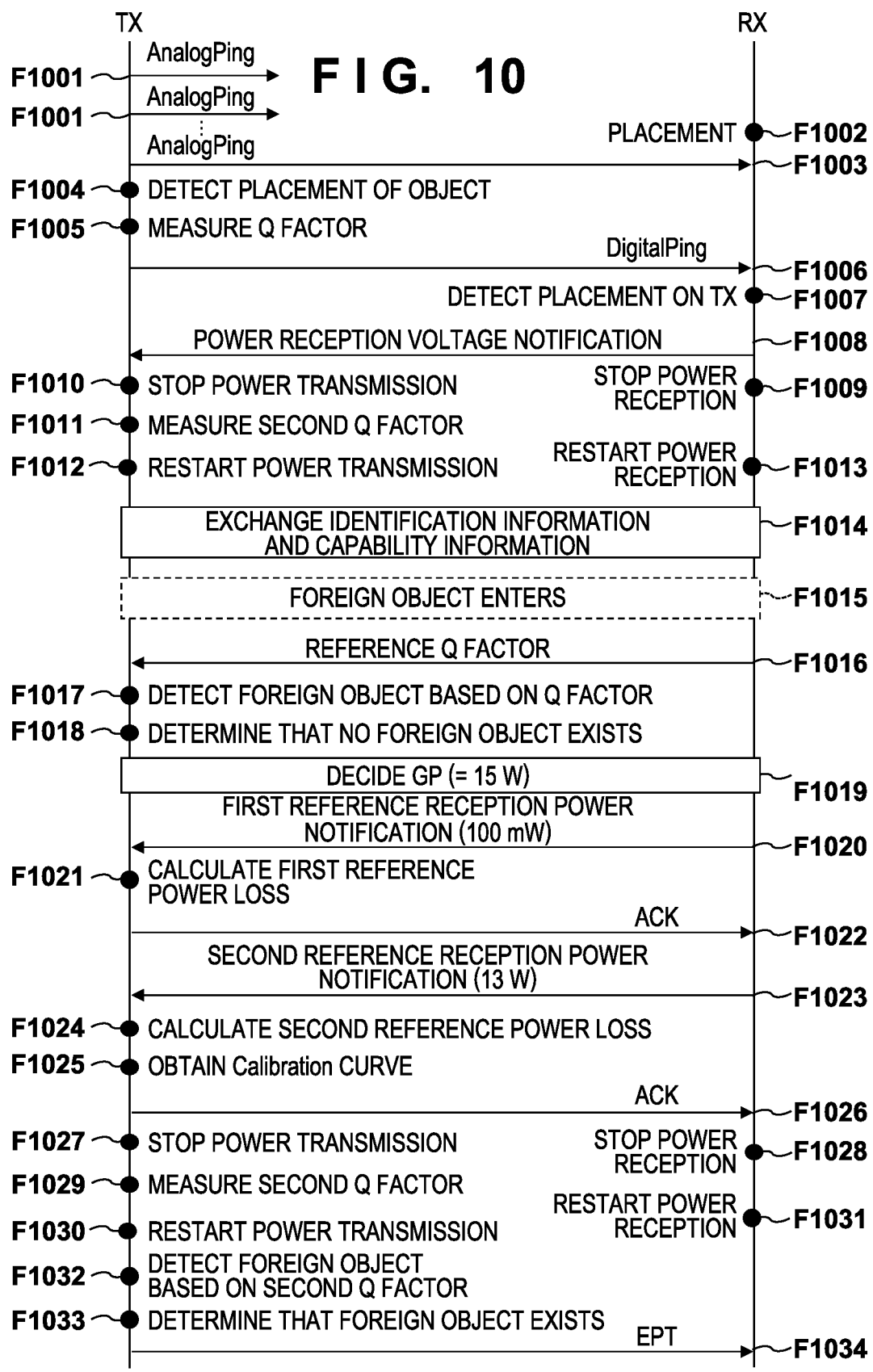

POWER TRANSMITTING APPARATUS, POWER RECEIVING APPARATUS, CONTROL METHODS THEREOF, AND STORAGE MEDIUM

CROSS-REFERENCE TO RELATED APPLICATIONS

This application is a Continuation of International Patent Application No. PCT/JP2021/006301, filed Feb. 19, 2021, which claims the benefit of Japanese Patent Application No. 2020-064203, filed Mar. 31, 2020, both of which are hereby incorporated by reference herein in their entirety.

BACKGROUND

Field

The present disclosure relates to a power transmitting apparatus and power receiving apparatus in wireless power transfer, control methods thereof, and a storage medium.

Background Art

Techniques for wireless power transfer systems have been widely developed. Patent literature 1 describes a method of detecting a foreign object at the time of power transmission/reception. This method complies with a standard (WPC standard) developed by Wireless Power Consortium (WPC) that is a standards organization for wireless charging standards. In patent literature 1, the Q factor (Quality factor) of the coil of a wireless power transfer system is measured before the start of power transmission/reception, and foreign object detection is performed based on the measured Q factor and a reference Q factor received from a power receiving apparatus. When it is determined by the foreign object detection based on the Q factor that no foreign object exists, the estimated value of a power loss between the power transmitting apparatus and the power receiving apparatus is calculated. After the start of power transmission/reception, foreign object detection is performed based on a difference between the estimated value and measured value of the power loss. Here, the foreign object is an object other than the power receiving apparatus.

CITATION LIST

Patent Literature

PTL 1: Japanese Patent Laid-Open No. 2018-113849

According to the WPC standard, exchange of identification information and capability information, negotiation of various parameters regarding power transmission/reception, and the like are performed between the power transmitting apparatus and the power receiving apparatus subsequently to measurement of the Q factor by the power transmitting apparatus. Then, the power transmitting apparatus performs foreign object detection based on the reference Q factor and the measured Q factor, and if no foreign object is detected, calculates the estimated value of a power loss. When a foreign object enters during a time until the estimated value of the power loss is calculated after measurement of the Q factor, the power transmitting apparatus cannot detect a foreign object. If the foreign object enters during this time, the estimated value of the power loss is calculated in the presence of the foreign object. Thus, the accuracy decreases in foreign object detection based on the power loss after the start of power transmission.

The present disclosure provides a technique for suppressing a decrease in the accuracy of foreign object detection.

SUMMARY

According to one aspect of the present disclosure there is provided a power transmitting apparatus comprising: a power transmitting unit configured to perform wireless power transfer to a power receiving apparatus; a measuring unit configured to measure a Q factor of the power transmitting unit; a first obtaining unit configured to obtain a first index value regarding a predetermined physical amount different from the Q factor after measurement of the Q factor; a first determining unit configured to determine presence/absence of an object different from the power receiving apparatus based on a Q factor represented by information received from the power receiving apparatus, and a Q factor measured by the measuring unit; a second obtaining unit configured to obtain a second index value regarding the predetermined physical amount before wireless power transfer to the power receiving apparatus starts after the first determining unit determines that an object different from the power receiving apparatus does not exist; and a second determining unit configured to determine presence/absence of an object different from the power receiving apparatus based on the first index value and the second index value.

Further features of the present disclosure will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the present disclosure and, together with the description, serve to explain principles of the present disclosure.

FIG. 10 is a chart showing an example of processing executed by a wireless power transfer system according to the second embodiment.

DESCRIPTION OF THE EMBODIMENTS

Figure 1:
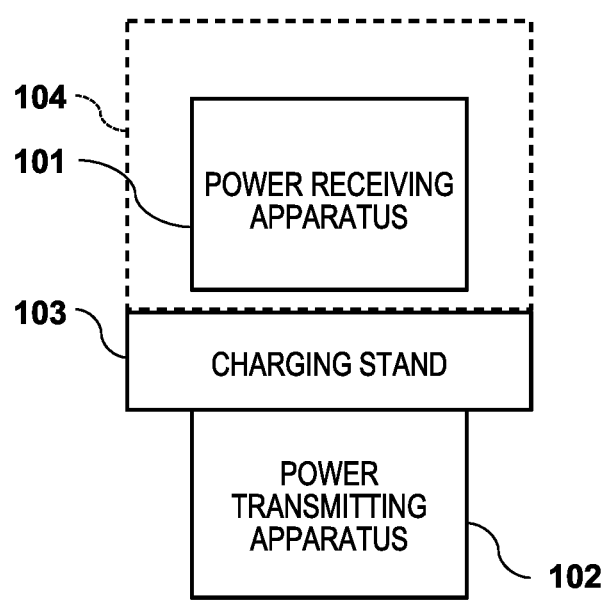
FIG. 1 is a view showing an example of the configuration of a wireless power transfer system according to the first embodiment.

Hereinafter, embodiments will be described in detail with reference to the attached drawings. Note, the following embodiments are not intended to limit the scope of the present disclosure. Multiple features are described in the embodiments, but limitation is not made to the present disclosure that requires all such features, and multiple such features may be combined as appropriate. Furthermore, in the attached drawings, the same reference numerals are given to the same or similar configurations, and redundant description thereof is omitted.

First Embodiment (System Configuration)

FIG. 1 shows an example of the configuration of a wireless charging system (wireless power transfer system) according to the first embodiment. This system includes, for example, a power receiving apparatus 101 and a power transmitting apparatus 102. In some cases, the power receiving apparatus 101 is called RX, and the power transmitting apparatus 102 is called TX. The RX is an electronic device that receives power from the TX and charges an internal battery. The TX is an electronic device that wirelessly transmits power to the RX placed on a charging stand 103. A range 104 represents a power transmission range in which the RX can receive power transmitted from the TX. Note that the RX and the TX can have a function of executing an application other than wireless charging. An example of the RX is a smartphone, and an example of the TX is an accessory device for charging the smartphone. The RX and the TX may be storage devices such as a hard disk device or a memory device, or information processing apparatuses such as a personal computer (PC). The RX and the TX may be image capturing apparatuses (for example, a camera or a video camera), image input apparatuses such as a scanner, or image output apparatuses such as a printer, a copying machine, or a projector. Further, the TX may be a smartphone. In this case, the RX may be, for example, another smartphone or a wireless earphone. The RX may be a vehicle such as an automobile, or a transport, and the TX may be a charger installed in, for example, the console of the vehicle such as an automobile or the transport.

The system performs wireless power transfer using an electromagnetic induction method for wireless charging based on the WPC standard defined by WPC (Wireless Power Consortium). That is, the RX and the TX perform wireless power transfer for wireless charging based on the WPC standard between the power receiving coil of the RX and the power transmitting coil of the TX. Note that the wireless power transfer method is not limited to the method defined by the WPC standard, and may be another electromagnetic induction method, a magnetic field resonance method, an electric field resonance method, a microwave method, or a method using a laser or the like. Wireless power transfer is used for wireless charging in the embodiment, but may be performed for a purpose other than wireless charging.

In the WPC standard, the magnitude of power guaranteed when the RX receives power from the TX is defined by a value called Guaranteed Power (to be referred to as "GP" hereinafter). The GP represents a power value guaranteed to be output to the load of the RX such as a circuit for charging even if the positional relationship between the RX and the TX varies and the power transmission efficiency between the power receiving coil and the power transmitting coil decreases. For example, in a case in which the GP is 15 W, even if the positional relationship between the power receiving coil and the power transmitting coil varies and the power transmission efficiency decreases, the TX controls power transmission such that a power of 15 W can be output to the load in the RX. The WPC standard defines a method of detecting the presence of an object (foreign object) other than a power receiving apparatus around a TX (near a power receiving antenna). More specifically, the WPC standard defines a method of detecting a foreign object from a change of the quality factor (Q factor) of a power transmitting antenna (a power transmitting coil 303) in the TX, and a power loss method of detecting a foreign object from the difference between transmission power in the TX and reception power in the RX. Foreign object detection based on the Q factor is executed before power transfer (Negotiation phase or Renegotiation phase). Foreign object detection by the power loss method is executed during power transfer (power transmission) (Power Transfer phase to be described later) based on data obtained by performing calibration (to be described later). Note that the foreign object is, for example, a conductive object such as a metal piece or an IC card.

The RX and the TX according to the embodiment perform communication for power transmission/reception control based on the WPC standard, and communication for device authentication. Here, the communication for power transmission/reception control based on the WPC standard will be explained.

The WPC standard defines a plurality of phases including the Power Transfer phase in which power transfer is executed, and phases before performing actual power transfer. In each phase, communication for necessary power transmission/reception control is performed. The phases before power transfer can include a Selection phase, a Ping phase, an Identification and Configuration phase, a Negotiation phase, and a Calibration phase. Note that the Identification and Configuration phase will be referred to as an I&C phase.

In the Selection phase, the TX intermittently transmits an Analog Ping and detects that an object exists in a power transmission range (for example, the RX, a conductive piece, or the like is placed on the charging stand 103). In the Ping phase, the TX transmits a Digital Ping larger in power than the Analog Ping. The power of the Digital Ping has a magnitude large enough to activate the control unit of the RX placed on the TX. The RX notifies the TX of the magnitude of the power reception voltage by a Signal Strength packed. The TX receives a response (packet announcing the power reception voltage) from the RX that has received the Digital Ping transmitted by the TX, and recognizes that the object detected in the Selection phase is the RX. Upon receiving the power reception voltage notification from the RX, the TX shifts to the I&C phase. Before transmitting a Digital Ping, the TX measures the Q factor (Q-Factor) of the power transmitting antenna (power transmitting coil 303). The measurement result is used when executing foreign object detection processing using the Q factor.

In the I&C phase, the TX identifies the RX and obtains device configuration information (capability information) from the RX. For this purpose, the RX transmits an ID packet and a Configuration packet. The ID packet includes identifier information of the RX. The Configuration packet includes device configuration information (capability information) of the RX. The TX receives the ID packet and the Configuration packet, and responds to them by an acknowledgement (ACK). Then, the I&C phase ends.

In the Negotiation phase, a GP value is decided based on a GP value requested by the RX, the power transmission capability of the TX, and the like. The TX executes foreign object detection processing using the Q factor based on the measured Q factor and a reference Q factor (to be described later) based on the Q factor included in the request from the RX. The WPC standard defines a method of temporarily shifting to the Power Transfer phase, and then performing again processing similar to that in the Negotiation phase in accordance with a request from the RX. A phase in which these processes are performed after shift from the Power Transfer phase will be called the Renegotiation phase. In the Calibration phase, the RX notifies the TX of predetermined reception power values (for example, a reception power value in a light load state and a reception power value in a maximum load state) based on the WPC standard, and performs adjustment so that the TX efficiently transmits power. The reception power values notified of the TX can also be used for foreign object detection processing by the power loss method.

In the Power Transfer phase, control is performed for continuation of power transmission, stop of power transmission owing to an error or full charging, and the like. The TX and the RX perform communication for these power transmission/reception control operations based on the WPC standard. In the embodiment, these communications are performed by In-band communication in which a signal is superimposed using the same antenna (coil) as that for wireless power transfer. Note that a range in which the TX and the RX are capable of In-band communication based on the WPC standard is almost the same as the power transmission range. In FIG. 1, the range 104 represents a range in which wireless power transfer is possible by the power transmitting/receiving coils of the TX and RX, and a range in which In-band communication is possible. In the following description, "the RX is placed on the charging stand 103" means that the RX enters the range 104, and includes a state in which the RX is not actually placed on the charging stand 103.

(Arrangements of Power Receiving Apparatus 101 and Power Transmitting Apparatus 102)

Next, the arrangements of the power receiving apparatus 101 (RX) and power transmitting apparatus 102 (TX) according to the embodiment will be described. Note that the following arrangements are merely an example, and part (or all in some cases) of the arrangements to be described may be replaced with another arrangement having a similar function or omitted, and a further arrangement may be added to the arrangements to be described. Furthermore, one block to be described below may be divided into a plurality of blocks, or a plurality of blocks may be integrated into one block.

Arrangement of RX

Figure 2:
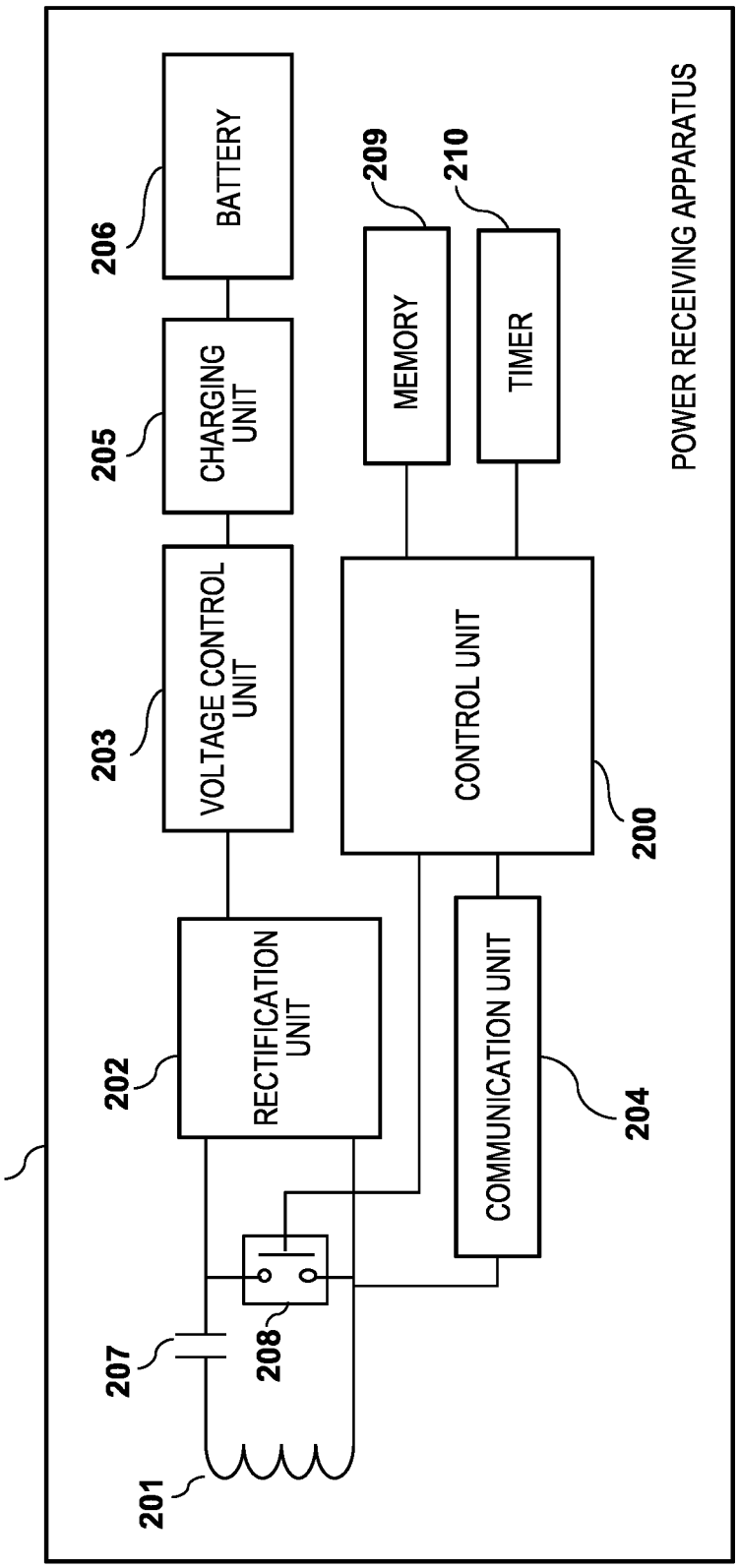
FIG. 2 is a block diagram showing an example of the arrangement of a power receiving apparatus according to the first embodiment.

FIG. 2 is a block diagram showing an example of the hardware arrangement of the RX according to the embodiment. The RX according to the embodiment complies with the WPC standard. The RX includes, for example, a control unit 200, a power receiving coil 201, a rectification unit 202, a voltage control unit 203, a communication unit 204, a charging unit 205, a battery 206, a resonant capacitor 207, a switch 208, a memory 209, and a timer 210.

The control unit 200 controls the whole RX by executing, for example, a control program stored in the memory 209. The control unit 200 may perform control to execute an application other than wireless power transfer. The control unit 200 is constituted including at least one or more processors such as a CPU (Central Processing Unit) and an MPU (Micro Processing Unit). Note that the control unit 200 may be constituted including hardware dedicated to specific processing such as an ASIC (Application Specific Integrated Circuit), or an array circuit such as an FPGA (Field Programmable Gate Array) complied to execute predetermined processing. The control unit 200 stores, in the memory 209, information that should be stored during execution of various processes. The control unit 200 can measure a time using the timer 210.

The power receiving coil 201 receives power from the power transmitting coil of the power transmitting apparatus. The power receiving coil 201 is connected to the resonant capacitor 207 and resonates at a specific frequency. The rectification unit 202 converts, into a DC voltage and DC current, an AC voltage and AC current from the power transmitting coil that are received via the power receiving coil 201. The voltage control unit 203 converts the level of the DC voltage input from the rectification unit into that of a DC voltage at which the control unit 200, the charging unit 205, and the like operate. The communication unit 204 performs control communication based on the above-mentioned WPC standard by In-band communication with the TX. The communication unit 204 demodulates an electromagnetic wave input from the power receiving coil 201 to obtain information transmitted from the TX. Then, the communication unit 204 modulates the electromagnetic wave with a load to superimpose, on the electromagnetic wave, information that should be transmitted to the TX, thereby communicating with the TX. That is, the communication performed by the communication unit 204 is superimposed on power transmitted from the power transmitting coil of the power transmitting apparatus. The charging unit 205 charges the battery 206 using power received via the power receiving coil 201. The battery 206 supplies power necessary for control, power reception, and communication to the whole RX. The battery 206 accumulates power received via the power receiving coil 201.

The switch 208 is a switch for short-circuiting the power receiving coil 201 and the resonant capacitor 207, and is controlled by the control unit 200. When the switch 208 is turned on, the power receiving coil 201 and the resonant capacitor 207 constitute a series resonant circuit. At this time, a current flows through only the closed circuit of the power receiving coil 201, resonant capacitor 207, and switch 208, and does not flow through the rectification unit 202 and the voltage control unit 203. When the switch 208 is turned off, a current flows through the rectification unit 202 and the voltage control unit 203 via the power receiving coil 201 and the resonant capacitor 207. The memory 209 stores various kinds of information, as described above. Note that the memory 209 may store information obtained by a function unit different from the control unit 200. The timer 210 includes, for example, a count-up timer that measures a time elapsed from the time of activation, or a count-down timer that counts down the time from set time. The timer 210 measures the time using these timers.

Arrangement of TX

Figure 3:
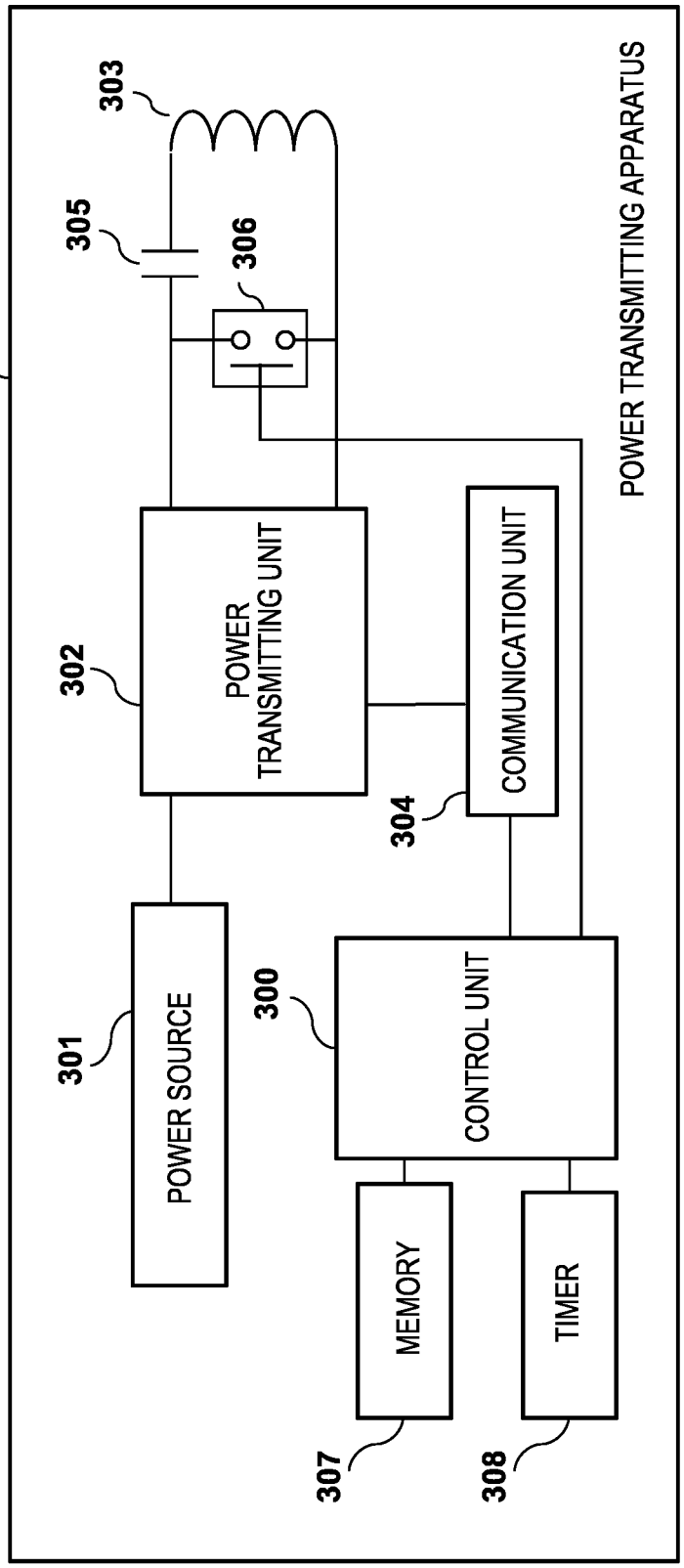
FIG. 3 is a block diagram showing an example of the arrangement of a power transmitting apparatus according to the first embodiment.

FIG. 3 is a block diagram showing an example of the hardware arrangement of the TX according to the embodiment. The TX according to the embodiment complies with the WPC standard. The TX includes, for example, a control unit 300, a power source 301, a power transmitting unit 302, a power transmitting coil 303, a communication unit 304, a resonant capacitor 305, a switch 306, a memory 307, and a timer 308.

The control unit 300 controls the whole TX by executing, for example, a control program stored in the memory 307. The control unit 300 may perform control to execute an application other than wireless power transfer. The control unit 300 is constituted including at least one or more processors such as a CPU (Central Processing Unit) and an MPU (Micro Processing Unit). Note that the control unit 300 may be constituted including hardware dedicated to specific processing such as an application specific integrated circuit (ASIC), or an array circuit such as an FPGA (Field Programmable Gate Array) complied to execute predetermined processing. The control unit 300 stores, in the memory 307, information that should be stored during execution of various processes. The control unit 300 can measure a time using the timer 308.

The power source 301 supplies power necessary for control, power transmission, and communication to the whole TX. The power source 301 is, for example, a commercial power source or a battery. The power transmitting unit 302 converts DC or AC power input from the power source 301 into AC power of a frequency band used for wireless power transfer, and inputs the AC power to the power transmitting coil 303, generating an electromagnetic wave for the RX to receive power. Note that the frequency (AC frequency) of AC power generated by the power transmitting unit 302 is about several hundred kHz (for example, 110 kHz to 205 kHz). Based on an instruction from the control unit 300, the power transmitting unit 302 inputs the AC power of the above-mentioned AC frequency to the power transmitting coil 303 so as to output, from the power transmitting coil 303, an electromagnetic wave for transmitting power to the RX. The power transmitting unit 302 controls the strength of the output electromagnetic wave by adjusting a voltage (power transmission voltage) or a current (power transmission current) input to the power transmitting coil 303. The strength of the electromagnetic wave is increased by increasing the power transmission voltage or the power transmission current, and decreased by decreasing the power transmission voltage or the power transmission current. The power transmitting unit 302 controls output of power of the AC frequency so as to start or stop power transmission from the power transmitting coil 303 based on an instruction from the control unit 300. The power transmitting coil 303 is connected to the resonant capacitor 305 and resonates at a specific frequency.

The communication unit 304 performs control communication based on the above-mentioned WPC standard by In-band communication with the RX. The communication unit 304 demodulates an electromagnetic wave input from the power transmitting coil 303 and transfers information to the RX. The communication unit 304 demodulates an electromagnetic wave that has been output from the power transmitting coil 303 and modulated by the RX, thereby obtaining information transmitted from the RX. That is, the communication performed by the communication unit 304 is superimposed on power transmission from the power transmitting coil 303. The switch 306 is a switch for short-circuiting the power transmitting coil 303 and the resonant capacitor 305, and is controlled by the control unit 300. When the switch 306 is turned on, the power transmitting coil 303 and the resonant capacitor 305 constitute a series resonant circuit. At this time, a current flows through only the closed circuit of the power transmitting coil 303, resonant capacitor 305, and switch 306. When the switch 306 is turned off, power is supplied from the power transmitting unit 302 to the power transmitting coil 303 and the resonant capacitor 305. The memory 307 stores various kinds of information, as described above. Note that the memory 307 may store information obtained by a function unit different from the control unit 300. The timer 308 measures the time using, for example, a count-up timer that measures a time elapsed from the time of activation, or a count-down timer that counts down the time elapsed from set time.

Functional Arrangement of TX

Figure 4:
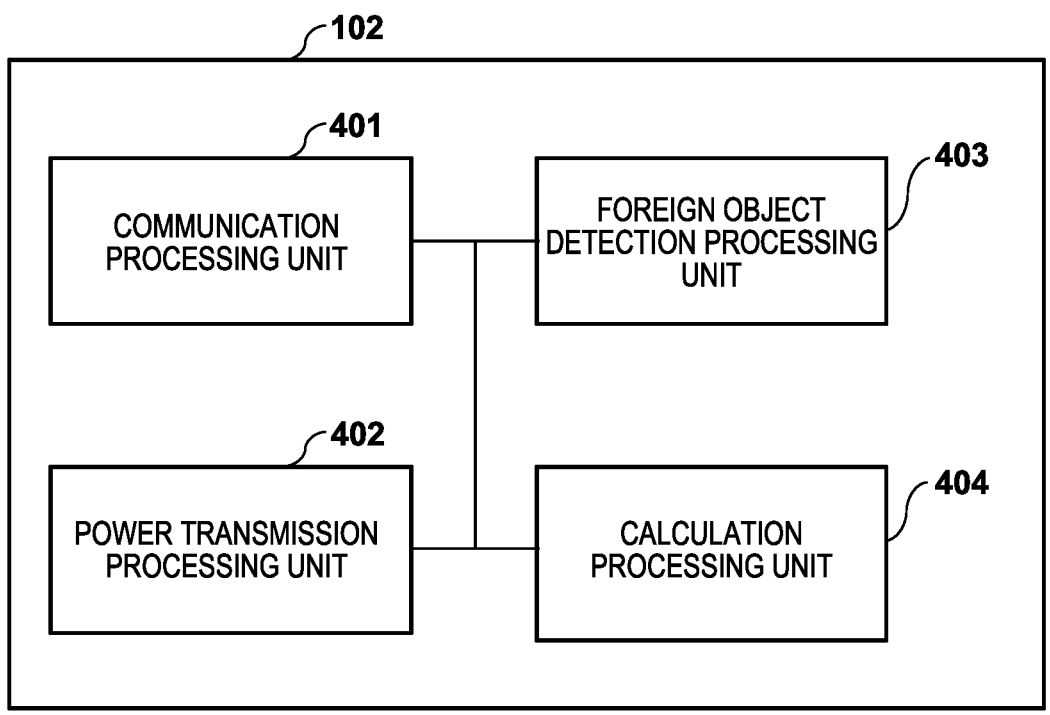
FIG. 4 is a block diagram showing an example of the functional arrangement of the control unit of the power transmitting apparatus according to the first embodiment.

Next, the functional arrangement of the control unit 300 of the TX will be described with reference to FIG. 4. The control unit 300 includes a communication processing unit 401, a power transmission processing unit 402, a foreign object detection processing unit 403, and a calculation processing unit 404.

The communication processing unit 401 controls communication with the RX via the communication unit 304 based on the WPC standard. The power transmission processing unit 402 controls the power transmitting unit 302 and controls power transmission to the RX based on the WPC standard.

The foreign object detection processing unit 403 detects a foreign object by measuring a power loss between the power transmitting apparatus and the power receiving apparatus and a Q factor in the power transmitting antenna (power transmitting coil 303). The foreign object detection processing unit 403 can implement a foreign object detection function by the power loss method, and a foreign object detection function based on the Q factor. These foreign object detection functions will be described later. Note that the foreign object detection processing unit 403 may perform foreign object detection processing using another method. For example, in a TX having an NFC communication function, foreign object detection processing may be performed using an opposite device detection function based on the NFC standard. Note that NFC stands for Near Field Communication. The foreign object detection processing unit 403 can also measure a Q factor in the time domain and perform foreign object detection based on the measurement result. The Q factor measurement in the time domain will be described later. As a function other than the foreign object detection, the foreign object detection processing unit 403 can also detect a change of the state on the TX. For example, the foreign object detection processing unit 403 can also detect an increase/decrease in the number of power receiving apparatuses in the range 104.

The calculation processing unit 404 measures power output to the RX via the power transmitting unit 302, and calculates an average output power value every unit time. The foreign object detection processing unit 403 performs foreign object detection processing by the power loss method based on a calculation result obtained by the calculation processing unit 404 and a reception power value received from the power receiving apparatus via the communication processing unit 401. The communication processing unit 401, the power transmission processing unit 402, the foreign object detection processing unit 403, and the calculation processing unit 404 implement their functions as programs running in the control unit 300. The respective processing units are constituted as independent programs, and can operate in parallel while establishing a synchronization between the programs by event processing or the like.

(Foreign Object Detection Method)

Foreign Object Detection Method Based on Q Factor

Next, the foreign object detection method based on the Q factor defined by the WPC standard that is executed by the foreign object detection processing unit 403 will be explained. First, the TX actually measures, in the frequency domain, the Q factor that changes under the influence of a foreign object (Q factor measurement). The Q factor measurement is executed until a Digital Ping is transmitted after transmitting an Analog Ping. More specifically, the power transmitting unit 302 sweeps the frequency of wireless power output from the power transmitting coil 303, and measures a voltage value at the end of the resonant capacitor 305 series (or parallel)-connected to the power transmitting coil 303. The power transmitting unit 302 searches for a resonance frequency f1 at which the voltage value peaks, and calculates the Q factor (f1/(f2−f3)) of the power transmitting coil using frequencies f2 and f3 representing voltage values smaller by 3 dB from the peak voltage value (voltage value measured at the resonance frequency). Another example of the Q factor measurement method is as follows: the power transmitting unit 302 sweeps the frequency of wireless power output from the power transmitting coil 303, measures a voltage value at the end of the resonant capacitor 305 series-connected to the power transmitting coil 303, and searches for a resonance frequency at which the voltage value peaks. The power transmitting unit 302 measures voltage values at the two ends of the resonant capacitor 305 at the resonance frequency, and calculates the Q factor of the power transmitting coil 303 from the ratio of the measured voltage values.

Then, the TX obtains, from the RX, a Q factor serving as the determination criterion of foreign object detection. More specifically, the TX receives, from the RX, the Q factor of the power transmitting coil 303 when the RX is placed in the range 104 defined by the WPC standard in which power transmission by the power transmitting coil 303 is possible. The Q factor is stored in an FOD (Foreign Object Detection) status packet received from the RX. From the Q factor stored in the FOR Status packet (Q factor held by the RX), the TX analogizes the Q factor of the power transmitting coil 303 when the RX is placed on the TX. The analogized Q factor will be referred to as a reference Q factor in the embodiment. Note that the Q factor stored in the FOR Status packet is stored in advance in the nonvolatile memory (for example, memory 209) of the RX. The foreign object detection processing unit 403 of the TX compares the reference Q factor and the actually measured Q factor, and determines the presence/absence of a foreign object based on the comparison result. More specifically, a Q factor smaller by a % from the reference Q factor is set as a threshold. If the actually measured Q factor is smaller than the threshold, it is determined that a foreign object exists; otherwise, it is determined that no foreign object exists.

Foreign Object Detection Method Based on Power Loss Method

Figure 7:
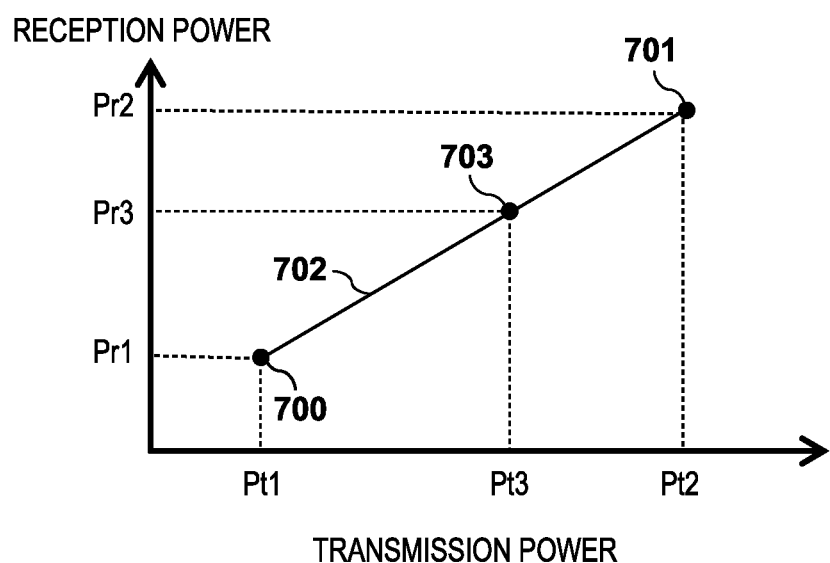
FIG. 7 is a graph for explaining foreign object detection by the power loss method.

Next, the foreign object detection method based on the power loss method defined by the WPC standard that is executed by the foreign object detection processing unit 403 will be explained with reference to FIG. 7. In FIG. 7, the abscissa represents the transmission power of the TX, and the ordinate represents the reception power of the RX. The TX obtains a reception power value Pr1 of power received by the RX. The reception power value Pr1 is stored in, for example, a Received Power packet (mode 1), transmitted from the RX, and received by the TX. At this time, the RX does not supply the received power to the load (for example, charging circuit and battery), and the reception power value Pr1 represents a reception power value in a light load state. The TX stores the reception power value Pr1 and a transmission power value Pt1 at this time in the memory 307 (point 700). The TX recognizes that the power loss amount between the TX and the RX when power of the transmission power value Pt1 is transmitted is Pt1−Pr1 (Ploss1). Then, the TX obtains a reception power value Pr2 of power received by the RX. The reception power value Pr2 is stored in, for example, a Received Power packet (mode 2), transmitted from the RX, and received by the TX. The reception power value Pr2 is a reception power value in a connected load state in which the RX supplies received power to the load. The TX stores the reception power value Pr2 and a transmission power value Pt2 at this time in the memory 307 (point 701). The TX recognizes that the power loss amount between the TX and the RX when power of the transmission power value Pt2 is transmitted is Pt2−Pr2 (Ploss2).

After that, the TX creates a straight line 702 by interpolating the points 700 and 701 by a straight line. The straight line 702 represents the relationship between transmission power and reception power in a state in which no foreign object exists around the TX and the RX. From the transmission power value and the straight line 702, the TX can predict a reception power value in a state in which no foreign object is highly likely to exist. For example, when the transmission power value is Pt3, the TX predicts, from a point 703 on the straight line 702, that the reception power value in the RX is Pr3. Assume that when the TX transmits power of the transmission power value Pt3 to the RX, it receives a reception power value Pr3' from the RX. The TX calculates a value Pr3−Pr3' (=Ploss_FO) by subtracting the reception power value Pr3' actually received from the RX, from an estimated reception power value Pr3 in a state in which no foreign object exists. Ploss_FO can be regarded as a power loss consumed by a foreign object when the foreign object exists between the TX and the RX (for example, in the range 104). Hence, when the power Ploss_FO considered to be consumed by a foreign object exceeds a predetermined threshold, the TX determines that the foreign object exists.

Note that the foreign object detection procedures are not limited to those described above. For example, the following procedures may be adopted. That is, the TX obtains in advance, from the reception power value Pr3 in a state in which no foreign object exists, a power loss amount Pt3−Pr3 (Ploss3) between the TX and the RX. Then, the TX obtains, from the reception power value Pr3' received from the RX in a state in which a foreign object exists, a power loss amount Pt3−Pr3' (Ploss3') between the power transmitting apparatus and the power receiving apparatus in a state in which a foreign object exists. From Ploss3'−Ploss3 (=Ploss_FO), the TX obtains the power Ploss_FO considered to be consumed by the foreign object. As described above, the power Ploss_FO considered to be consumed by a foreign object may be obtained as Pr3−Pr3' (=Ploss_FO) or Ploss3'−Ploss3 (=Ploss_FO).

After obtaining the straight line 702, the power transmitting apparatus periodically receives the current reception power value Pr3' from the power receiving apparatus. The current reception power value periodically transmitted by the power receiving apparatus is transmitted as a Received Power packet (mode 0) to the power transmitting apparatus.

The power transmitting apparatus performs foreign object detection based on the straight line 702 and the reception power value stored in the Received Power packet (mode 0). The foregoing is the description of foreign object detection based on the power loss method. Note that the points 700 and 701 for obtaining the straight line 702 representing the relationship between transmission power and reception power in a state in which no foreign object exists around the power transmitting apparatus and the power receiving apparatus will be referred to as calibration data points in the embodiment. A line segment (straight line 702) obtained by interpolating at least two calibration data points will be referred to as a calibration curve. Note that the "curve" used may include a straight line as part or all of the calibration curve.

(Sequence of Processing by Power Transmitting Apparatus 102)

Figure 5:
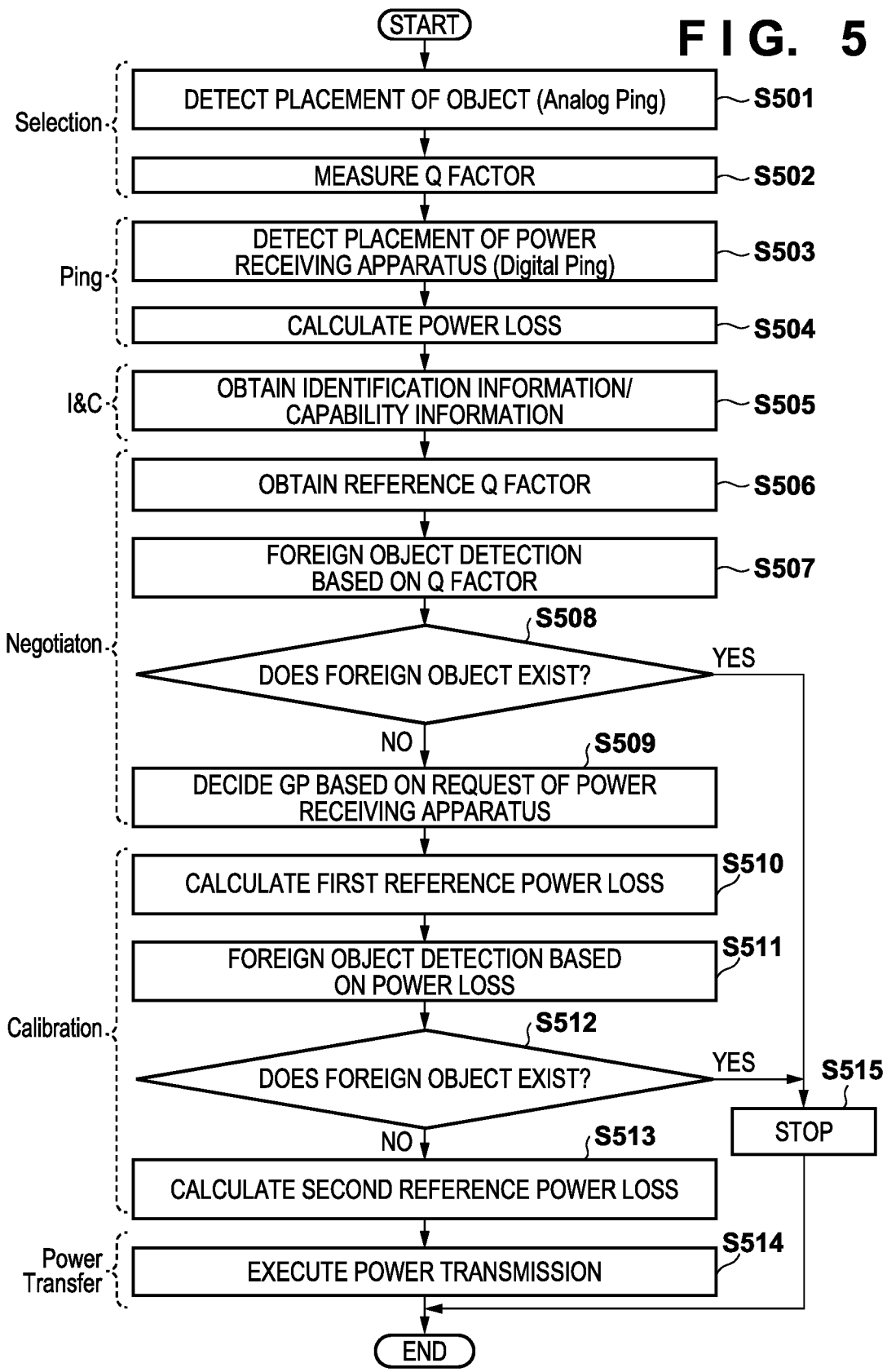
FIG. 5 is a flowchart showing an example of processing by the power transmitting apparatus according to the first embodiment.

An example of the sequence of processing executed by the TX will be described. FIG. 5 shows an example of the sequence of processing executed by the TX. This processing can be implemented by, for example, executing a program read out from the memory 307 by the control unit 300 of the TX. Note that at least some of the following procedures may be implemented by hardware. The hardware in this case can be implemented by automatically generating a dedicated circuit using a gate array circuit such as an FPGA from a program for implementing each processing step by using a predetermined compiler. This processing can be executed in accordance with the ON operation of the power source of the TX, input of an instruction to start a wireless charging application by the user of the TX, or connection of the TX to a commercial power source to receive the supply of power. This processing may be started by another trigger.

First, the TX starts processing defined as the Selection phase in the WPC standard. In the Selection phase, the TX repeats intermittent transmission of an Analog Ping in the WPC standard, and searches for an object present within the power transmission range 104 (step S501). If the TX detects an object present within the power transmission range 104, it measures a Q factor (measures a Q factor in the frequency domain) in order to perform the above-described foreign object detection based on the Q factor, and stores the result (step S502). After measuring the Q factor, the TX shifts to the Ping phase in the WPC standard to transmit a Digital Ping. If the TX receives a predetermined response to the Digital Ping, it determines that the detected object is the RX and the RX has been placed on the charging stand 103 (step S503). If the TX detects that the RX has been placed on the charging stand 103, it calculates a power loss Ploss0 (step S504). At this time, the power loss is calculated from a difference between a reception power value received from the RX and a transmission power value in the TX at that time. Note that the power loss calculated at this time is equivalent to a value in the light load state in which the RX does not supply received power to the load.

After calculating the power loss, the TX shifts to the I&C phase in the WPC standard to obtain identifier information and capability information of the RX (step S505). The identifier information of the RX can include a manufacturer code and a basic device ID in the WPC standard. The capability information of the RX includes an information element for specifying the version of a corresponding WPC standard, a value (maximum power value) for specifying maximum power that can be supplied to the load by the RX, and information representing whether the RX has the negotiation function in the WPC standard. Note that these are merely an example, and the identifier information and capability information of the RX may be substituted with other information or include other information in addition to the above-mentioned information. For example, the identifier information may include another arbitrary identifier information capable of identifying a RX individual, such as a wireless power ID. The TX may obtain identifier information and capability information of the RX by a method other than communication in the I&C phase.

Subsequently, the TX shifts to the Negotiation phase in the WPC standard to receive an FOR Status packet from the RX and obtain a reference Q factor based on the contents of the packet (step S506). After obtaining the reference Q factor, the TX performs the above-described "foreign object detection based on the Q factor" (step S507), and determines whether a foreign object exists in the range 104 (step S508). More specifically, the TX determines the presence/absence of a foreign object by comparing the Q factor measured in step S502 and the reference Q factor obtained in step S503. If the TX determines that a foreign object exists (YES in step S508), it stops the processing (step S515). If the TX determines that no foreign object exists (NO in step S508), it decides a GP value with the RX (step S509). In step S509, the procedure is not limited to communication in the Negotiation phase of the WPC standard, and another procedure to decide GP may be executed. If the RX does not support the Negotiation phase, the TX may set the GP value at, for example, a predetermined value defined in advance by the WPC standard without performing communication in the Negotiation phase. Based on, for example, information obtained in step S505 (I&C phase), the TX can determine whether the RX supports the Negotiation phase.

After deciding GP, the TX shifts to the Calibration phase in the WPC standard to calculate the first reference power loss for creating the above-mentioned calibration curve (step S510). The first reference power loss is the power loss Ploss1 in the light load state in which the RX does not supply received power to the load. As described above with reference to FIG. 7, the first reference power loss is calculated from the reception power value Pr1 received from the RX and the transmission power value Pt1 at that time. After calculating the first reference power loss, the TX performs foreign object detection based on the power loss Ploss0 calculated in step S504 and the first reference power loss Ploss1 (step S511), and determines whether a foreign object exists (step S512). Whether a foreign object exists is determined by calculating a difference (Ploss1−Ploss0) between the power loss calculated in step S504 and the first reference power loss, and determining whether the difference is equal to or larger than a threshold. If the TX determines that a foreign object exists (YES in step S512), it stops the processing (or power transmission) (step S515).

If the TX determines that no foreign object exists (NO in step S512), it calculates the second reference power loss (step S513). The second reference power loss is the power loss Ploss2 in the connected load state in which the RX supplies received power to the load. As described above, the second reference power loss is calculated from the reception power value Pr2 received from the RX and the transmission power value Pt2 at that time. After calculating the second reference power loss, the TX creates a calibration curve from the first reference power loss Ploss1 and the second reference power loss Ploss2, and executes power transmission (step S514). The power transmission by the TX is performed by processing in the Power Transfer phase of the WPC standard. However, the power transmission is not limited to this and may be performed by a method other than the WPC standard.

(Sequence of Processing Executed by System)

Figure 6:
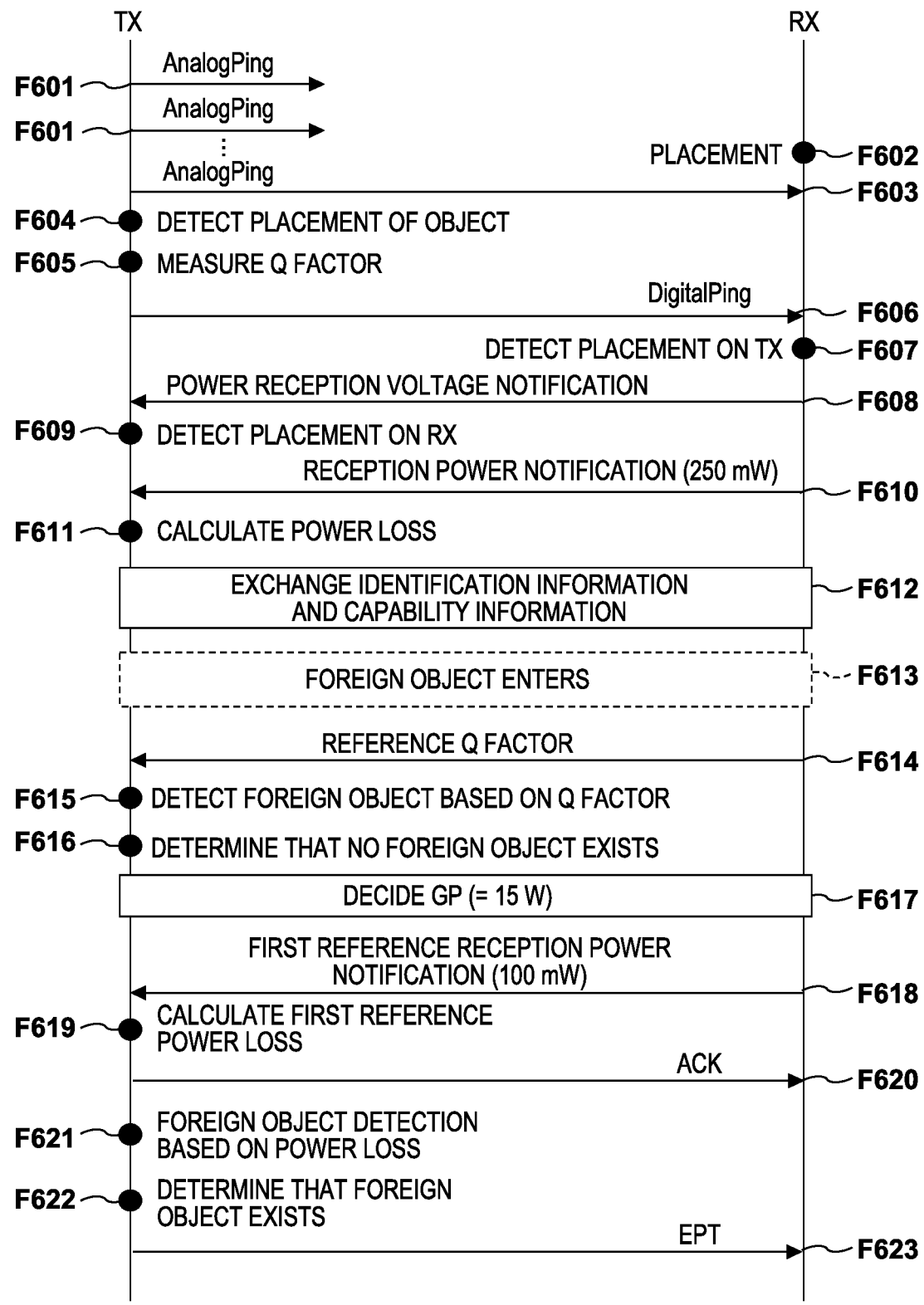
FIG. 6 is a chart showing an example of processing executed by the wireless power transfer system according to the first embodiment.

An operation sequence in the system (TX and RX) according to the first embodiment will be described with reference to FIG. 6. Assume that, as an initial state, the RX is not placed in the power transmission range of the TX, and the TX has a power transmission capability enough to execute power transmission with GP requested by the RX. A case will be explained in which a foreign object enters after the TX detects the placement of the RX and performs measurement of the Q factor (step S502) and calculation of the power loss (step S504). In this case, the Q factor is measured before the foreign object enters, so it is determined by the "foreign object detection method based on the Q factor" that no foreign object exists, and processing in the Calibration phase is executed. However, the difference between the first reference power loss (step S510) and the power loss (step S504) calculated upon detecting the placement of the RX becomes equal to or larger than the threshold. Thus, the TX determines that the foreign object exists, and stops the processing before the start of power transmission. This will be described with reference to FIG. 6.

The TX waits based on an Analog Ping until an object is placed (step S501 and F601). If the RX is placed on the charging stand 103 (F602), the Analog Ping changes (F603). The TX detects the change and detects that any object has been placed on the charging stand 103 (F604). After the TX detects that the object has been placed on the charging stand 103, it measures the Q factor of the power transmitting coil (step S502 and F605). The TX transmits a Digital Ping as a placement detection request (step S503 and F606). Upon receiving the Digital Ping, the RX detects that the RX has been placed on the charging stand 103 of the TX (F607), and transmits a packet (power reception voltage notification) for notifying the TX of a power reception voltage value (F608). The TX receives the power reception voltage notification serving as a response to the Digital Ping (F608), and detects that the placed object is the RX (F609). The power reception voltage notification can be, for example, a Signal Strength packed in the WPC standard.

The TX adjusts the transmission power, and if it receives from the RX a reception power notification that the reception power value is 250 mW (F610), calculates the power loss Ploss0 from the difference between the transmission power value at that time and the received reception power value (step S504 and F611). At this time, power transmitted from the TX and received by the RX is large enough to activate the control unit 200 of the RX. A power loss calculated at this time can be equivalent to the power loss (that is, the first reference power loss Ploss1) in the light load state in which the RX does not supply received power to the load. Note that the reception power notification can be the Received Power packet (mode 0) in the WPC standard. However, the reception power notification is not limited to this and, for example, a specific request defined by the WPC standard may be used. Also, the reception power value may be notified by including it in the power reception voltage notification, that is, the Signal Strength packed in F608. In this case, the reception power notification in F610 can be omitted.

Subsequently, the TX obtains identification information and capability information from the RX by communication in the I&C phase (step S505 and F612). At this time, assume that a foreign object enters the power transmission range 104 of the TX (F613). The TX obtains a reference Q factor based on a Q factor notified from the RX (step S506 and F614), and performs foreign object detection based on the Q factor measured in F605 and the reference Q factor (step S507 and F615). Since the foreign object enters after the Q factor is measured in F605, the TX determines in this foreign object detection that no foreign object exists (NO in step S508 and F616).

The GP is decided by communication in the Negotiation phase between the TX and the RX (step S509 and F617). In this example, GP=15 W is decided. Then, the TX adjusts transmission power and receives the first reference reception power notification by communication in the Calibration phase (F618). The transmission power is adjusted to be equal to, for example, transmission power when the reception power notification of 250 mW is received in F610. In the example of FIG. 6, the foreign object has entered (F613), so the first reference reception power notification of the reception power value=100 mW is received from the RX. The TX calculates the power loss Ploss1 from the difference between the reception power value stored in the received first reference reception power notification and the transmission power value of the TX (step S510 and F619), and transmits ACK serving as a response representing acknowledgement (F620). Upon transmitting the ACK, the TX performs foreign object detection based on the difference between the power loss Ploss0 calculated in F611 and the first reference power loss Ploss1 calculated in F619 (step S511 and F620). In the example of FIG. 6, the difference between the power loss calculated in F611 and the power loss calculated in F619 becomes equal to or larger than the threshold owing to the entrance of the foreign object. The TX determines that the foreign object exists (YES in step S512 and F622), transmits EPT (End Power Transfer Packet) to the RX, and stops the processing (F623).

As described above, according to the first embodiment, the TX measures a Q factor for foreign object detection, and then obtains a power loss serving as the index value of a predetermined physical amount different from the Q factor for foreign object detection. The TX performs foreign object detection based on a power loss obtained in the Calibration phase performed after foreign object detection based on the Q factor, and a power loss obtained after measurement of the Q factor. The power loss after measurement of the Q factor is obtained in a short period after measurement of the Q factor. Thus, when it is determined by foreign object detection based on the Q factor that no foreign object exists, this power loss is considered to be obtained in a state in which a foreign object hardly exists. Even if a foreign object enters at an interval till the start of processing in the Calibration phase after measurement of the Q factor, the foreign object can be detected at high probability, and a safer wireless power transfer system can be implemented.

Modification

In the above-described example, the power loss Ploss0 in the light load state in which the RX does not supply received power to the load after measurement of the Q factor is obtained, and foreign object detection is performed based on the difference between the power loss Ploss0 and the first reference power loss Ploss1. When obtaining the power loss Ploss0, the transmission power of the TX is adjusted so that a reception power notification received from the RX represents 250 mW. However, the present disclosure is not limited to this. For example, it is also possible that the state of the RX is set to be the connected load state in which received power is supplied to the load, the power transmission output of the TX is increased to be a GP-equivalent reception (transmission) power value, and then a power loss is obtained using reception power represented by a reception power notification. In this case, foreign object detection may be performed based on the difference between a power loss obtained after measurement of the Q factor and the second reference power loss Ploss2. Alternatively, the TX may adjust (increase) the power transmission output to be a predetermined reception (transmission) power value, and then obtain a power loss. In this case, for example, foreign object detection can be performed based on the difference between a power loss after measurement of the Q factor and a power loss at a predetermined reception (transmission) power value on the calibration curve obtained in the Calibration phase. Foreign object detection may be performed by obtaining a power loss at a predetermined reception (transmission) power value while the power transmission output is increased during processing (during generation of the calibration curve) in the Calibration phase. That is, a reception power value received from the power receiving apparatus when generating the calibration curve can be used for foreign object detection. Foreign object detection is performed based on a power loss at a reception (transmission) power value larger than one in the light load state in which the RX does not supply received power to the load. Therefore, stable foreign object detection in which the influence of an outlier generated by noise or the like is relatively suppressed can be performed.

Although a power loss at one reception (transmission) power value is obtained as the power loss after measurement of the Q factor in the above-described example, power losses at a plurality of reception (transmission) power values may be obtained. In this case, foreign object detection can be performed by comparison with the sum, average value, median, and the like of differences from power losses at a plurality of reception (transmission) power values on an obtained calibration curve after the end of processing in the Calibration phase. A curve (to be referred to as an estimation curve) representing the correspondence between the power value and the power loss may be generated by measuring power losses at different reception (transmission) power values after measurement of the Q factor. In this case, the presence/absence of a foreign object may be detected by comparison between the estimation curve and the calibration curve. For example, an estimation curve is obtained by linearly interpolating a plurality of measurement values, the slope of the estimation curve is compared with the calibration curve, and when the difference or rate (ratio) of the slope or the like becomes equal to or larger than a threshold, it can be determined that a foreign object exists. Note that part or all of the estimation curve may be a straight line, similar to the calibration curve.

In obtaining a power loss after measurement of the Q factor, the calibration curve may be obtained by obtaining calibration data points (Ploss1 and Ploss2) as power losses at a plurality of reception (transmission) power values. In this case, if it is determined by foreign object detection based on the Q factor that no foreign object exists, it can be determined that even the calibration curve is obtained in a state in which a foreign object hardly exists. Hence, processing in the Calibration phase can be omitted. As described above, even when a foreign object enters after measurement of the Q factor, it can be detected by foreign object detection based on the power loss method executed during power transmission. A safer wireless power transfer system can be implemented.

If it is determined in step S508 that no foreign object exists, a power loss obtained in step S504 may be used as a point forming the calibration curve. That is, a power loss obtained in step S504 may be set as the first reference power loss. In this case, steps S511 and S512 can be skipped. This is because, when it is determined by foreign object detection based on the Q factor that no foreign object exists, no foreign object exists at the time of measuring the Q factor in step S502, and no foreign object is highly likely to exist even in step S504. If a foreign object is highly likely to enter between steps S502 and S504, the TX obtains reception power again from the RX in step S510, as described above.

It suffices to perform step S504 before negotiation between the TX and the RX. For example, the TX may obtain a reception power value from the RX before obtaining identification information and capability information from the RX in the I&C phase.

The process of obtaining a reception power value from the RX in step S504 may be performed between steps S503 and S505, and the process of calculating a power loss in step S504 may be performed after step S505. That is, the power loss may be calculated after step S505 as long as transmission power corresponding to a reception power value obtained from the RX is stored.

Second Embodiment

In the first embodiment, the power loss is used as the index of a predetermined physical amount for foreign object detection, different from the Q factor. However, foreign object detection based on the power loss is readily influenced by heat generation and the like, and a foreign object detection error and a determination error in which it is determined that no foreign object exists though a foreign object exists may occur. To further improve the accuracy of foreign object detection, foreign object detection may be executed using another physical amount different from the power loss. In the second embodiment, a measurement value for detecting an electrical change in a power transmitting coil 303 when a power transmitting unit 302 stops power transmission is used as an index value. As an example of this, a method of performing foreign object detection based on an index (Q factor in the time domain) representing the attenuation state of the power transmission waveform will be described. Note that the configuration of a wireless power transfer system and the arrangements of a power receiving apparatus and power transmitting apparatus in the second embodiment are similar to those in the first embodiment (FIGS. 1 to 4).

Figure 8A:
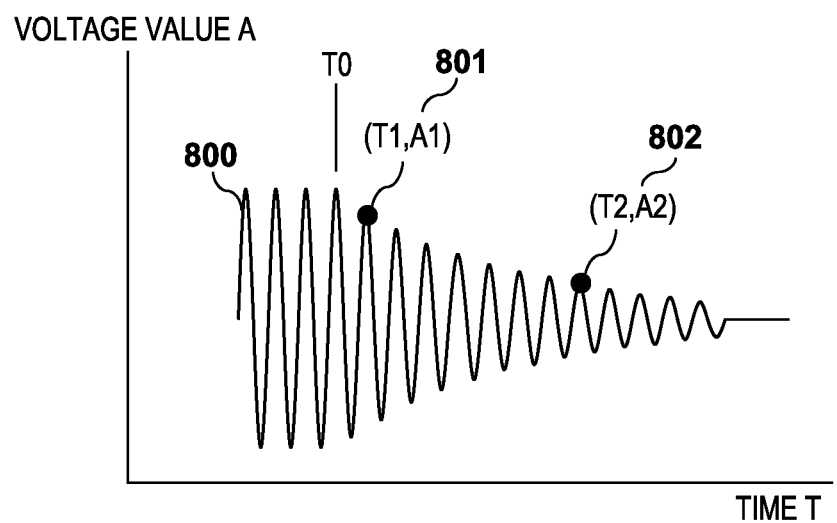
FIG. 8A is a graph for explaining a method of measuring a Q factor in the time domain.

First, a method of measuring a Q factor in the time domain will be explained. A waveform shown in FIG. 8A represents the temporal change of a voltage value (to be referred to as the voltage value of the power transmitting coil unit hereinafter) at the end of the power transmitting coil 303 or a resonant capacitor 305 in the TX. The abscissa represents the time, and the ordinate represents the voltage value. A waveform 800 represents a high-frequency voltage applied to the power transmitting coil 303. When the application of the high-frequency voltage is stopped at time T0, the voltage value of the power transmitting coil unit attenuates with the lapse of time. A point 801 is part of the envelope of the attenuating high-frequency voltage, and represents the voltage value of the power transmitting coil unit at time T1. In FIG. 8A, (T1, A1) represents that a voltage value at time T1 is A1. Similarly, a point 802 is part of the envelope of the high-frequency voltage, and represents the voltage value of the power transmitting coil unit at time T2. In FIG. 8A, (T2, A2) represents that a voltage value at time T2 is A2. The Q factor in the time domain is obtained based on the temporal change of the voltage value after time T0. More specifically, the Q factor in the time domain is calculated by equation (1)

based on the times and voltage values at the points 801 and 802 on the envelope of the voltage value, and a frequency f (to be referred to as an operating frequency hereinafter) of the high-frequency voltage:

$$Q = \pi f(T2-T1)/\ln(A1/A2) \quad (1)$$

Figure 8B:
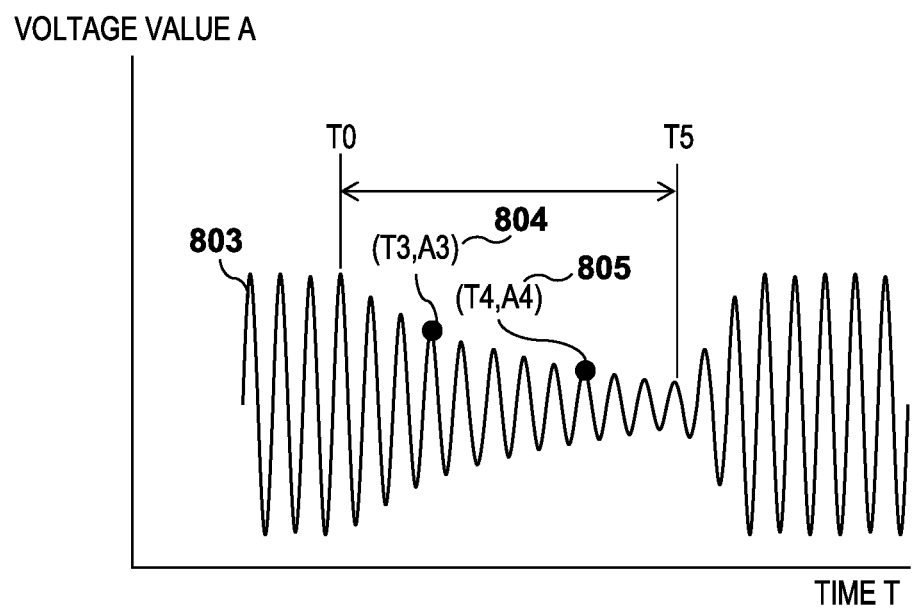
FIG. 8B is a graph for explaining a method of measuring a Q factor in the time domain.

Next, processing for measuring a Q factor in the time domain by the TX according to the second embodiment will be described with reference to FIG. 8B. A waveform 803 represents a high-frequency voltage applied to the power transmitting coil, and the frequency falls within a range of 110 kHz to 148.5 kHz, which is used in the Qi standard. Points 804 and 805 are part of the envelope of the voltage value. The TX stops power transmission in a section from time T0 to time T5. At this time, the RX turns on a switch 208 to short-circuit a power receiving coil 201 and a resonant capacitor 207, constitute a series resonant circuit, and stop power reception. The TX turns on a switch 306 to short-circuit the power transmitting coil 303 and a resonant capacitor 305, constitute a series resonant circuit, and stop power transmission. The TX measures a Q factor based on a voltage value A3 (point 804) of the power transmitting coil unit at time T3, a voltage value A4 (point 805) of the power transmitting coil unit at time T4, the operating frequency f of the high-frequency voltage, and equation (1). Note that the TX restarts power transmission at time T5. The Q factor calculated based on the lapse of time, the voltage value, and the operating frequency while the TX instantaneously interrupts power transmission will be called the second Q factor in the embodiment.

Even if the Q factor in the time domain is not measured, the presence/absence of a foreign object can be detected by measuring (T3, A3) and (T4, A4). That is, the presence/absence of a foreign object may be detected using an index based on the value of T4−T3, and the ratio A4/A3 of A4 to A3 or the ratio A3/A4 of A3 to A4, as represented by equation (1). More specifically, the presence/absence of a foreign object may be detected by comparing the index with a threshold.

It is also possible to measure a current value instead of a voltage value, and detect the presence/absence of a foreign object using an index based on the current value. That is, a current value at T3 and a current value at time T4 are measured. Alternatively, the second Q factor may be obtained based on the current value.

(Sequence of Processing by Power Transmitting Apparatus)

Figure 9A:
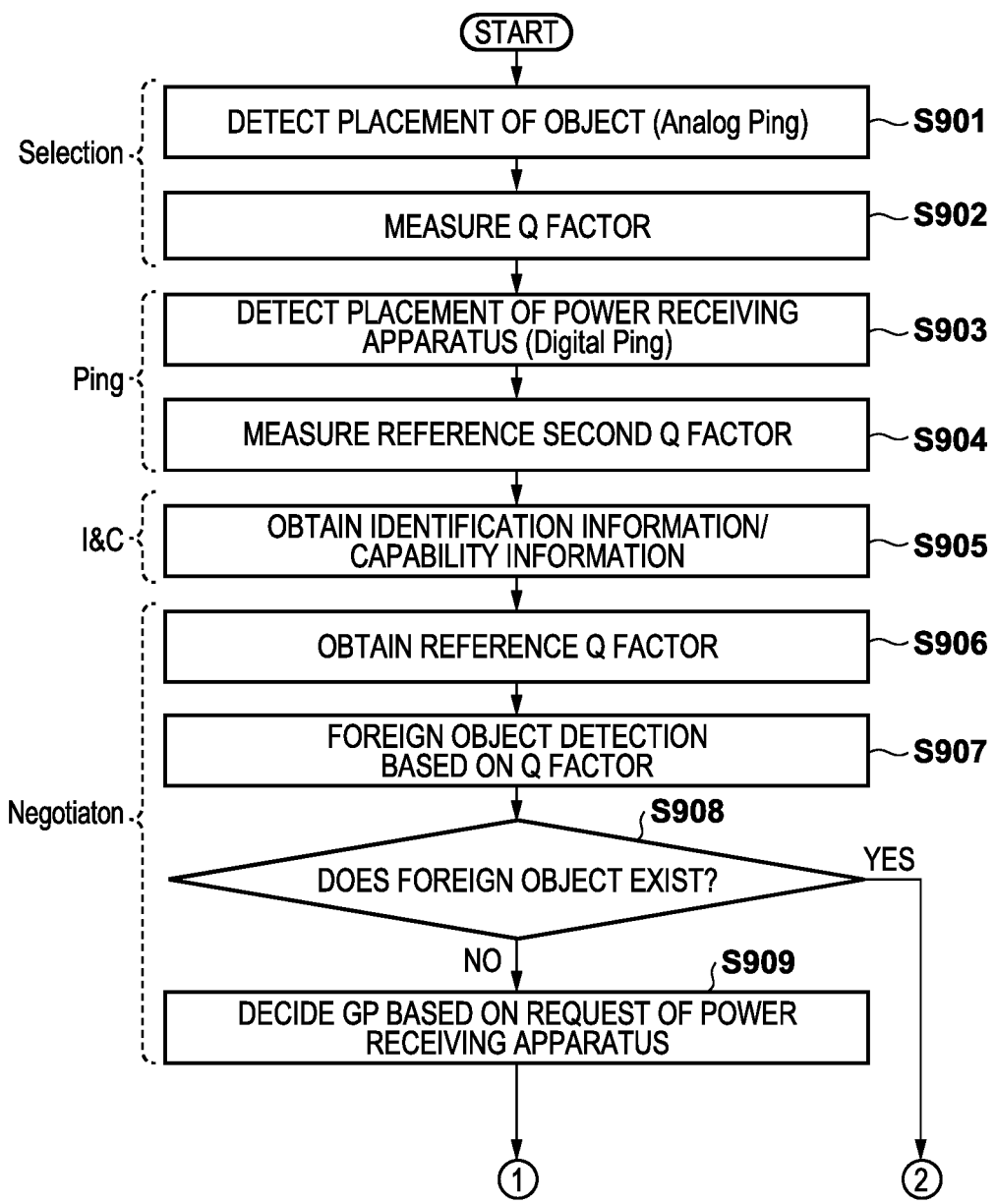
FIG. 9A is a flowchart showing an example of processing by a power transmitting apparatus according to the second embodiment.
Figure 9B:
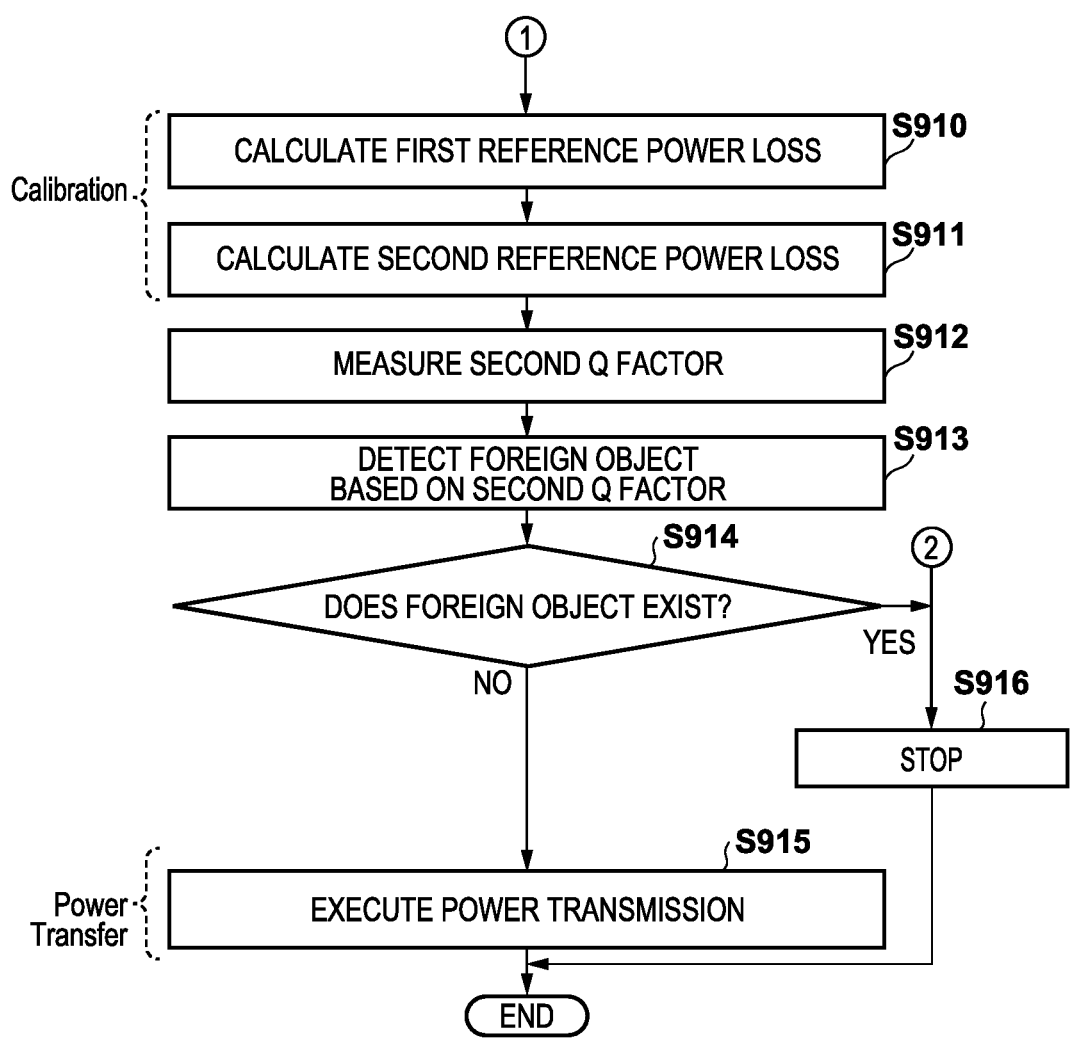
FIG. 9B is a flowchart showing the example of processing by the power transmitting apparatus according to the second embodiment.

An example of the sequence of processing executed by the TX when the above-mentioned second Q factor is applied as the second value different from the Q factor will be described. FIGS. 9A and 9B show an example of the sequence of processing executed by the TX according to the second embodiment. This processing can be implemented by, for example, executing a program read out from a memory 307 by a control unit 300 of the TX. Note that at least some of the following procedures may be implemented by hardware. The hardware in this case can be implemented by automatically generating a dedicated circuit using a gate array circuit such as an FPGA from a program for implementing each processing step by using a predetermined complier. This processing can be executed in accordance with the ON operation of the power source of the TX, input of an instruction to start a wireless charging application by the user of the TX, or connection of the TX to a commercial power source to receive the supply of power. This processing may be started by another trigger.

In steps S901 to S903, processes similar to those in steps S501 to S503 (FIG. 5) of the first embodiment are performed. Upon detecting the placement of the RX in step S903, the TX measures the second Q factor by the procedures described with reference to FIG. 8B (step S904). The second Q factor measured in step S904 will be referred to as a reference second Q factor. After the end of measuring the reference second Q factor, the TX shifts to the I&C phase in the WPC standard to obtain identifier information and capability information of the RX (step S905). In steps S905 to S909, processes similar to those in steps S505 to S509 (FIG. 5) of the first embodiment are performed.

After deciding GP, the TX shifts to the Calibration phase in the WPC standard to calculate the first reference power loss Ploss1 (step S910). Then, the TX calculates the second reference power loss Ploss2 (step S911). The TX obtains a calibration curve from the first reference power loss Ploss1 and the second reference power loss Ploss2. The TX measures the second Q factor by the procedure described in step S904 (step S912). The TX performs foreign object detection based on the reference second Q factor measured in step S904 and the second Q factor measured in step S912 (step S913), and determines whether a foreign object exists (step S914). The foreign object detection based on the second Q factor can be performed based on whether the difference between the reference second Q factor and the second Q factor is equal to or larger than a threshold. If the TX determines that a foreign object exists (YES in step S914), it stops the processing (or power transmission) (step S916). If the TX determines that no foreign object exists (NO in step S914), it executes power transmission (step S915). The power transmission is performed by processing in the Power Transfer phase of the WPC standard. However, the power transmission is not limited to this and may be performed by a method other than the WPC standard. The processing in step S912 is executed after the Calibration phase in the above description, but is not limited to this. For example, the processing in step S912 may be executed before the start of the Calibration phase.

(Sequence of Processing Executed by System)

An operation sequence in the system (TX and RX) when the second Q factor (Q factor in the time domain) is applied as the index of a physical amount of a type different from the Q factor in the frequency domain will be described with reference to FIG. 10. Assume that, as an initial state, the RX is not placed on the TX, and the TX has a power transmission capability enough to execute power transmission with GP requested by the RX. In the second embodiment, a case will be explained in which a foreign object enters after the TX detects the placement of the RX and measures a Q factor and a reference second Q factor. Since the Q factor is measured before the foreign object enters, it is determined by foreign object detection based on the Q factor that no foreign object exists. The TX measures the second Q factor after obtaining a calibration curve. Owing to the entrance of the foreign object, the difference between the measured second Q factor and the reference second Q factor measured at time of placing the RX becomes equal to or larger than the threshold. As a result, the TX determines that the foreign object exists. This will be described with reference to FIG. 10.

F1001 to F1008 are processes similar to F601 to F608 (FIG. 6) of the first embodiment. The RX transmits a power reception voltage notification, turns on the switch 208 by a control unit 200 after the first period to short-circuit the power receiving coil 201 and the resonant capacitor 207, constitute a series resonant circuit, and stop power reception (F1009). Similarly, the TX receives the power reception voltage notification, turns on the switch 306 by the control unit 300 after the first period to short-circuit the power transmitting coil 303 and the resonant capacitor 305, constitute a series resonant circuit, and stop power transmission (F1010). The first period is a period for synchronously stopping power transmission and power reception by the TX and the RX, and can take a predetermined value. After stopping the power transmission, the TX measures the second Q factor (step S904 and F1011), and stores it as the reference second Q factor in the memory 307. The TX turns off the switch 306 to restart power transmission the second period after the stop of power transmission in F1010 (F1012). Similarly, the RX turns off the switch 208 to restart power reception the second period after the stop of power reception in F1009 (F1013). The second period is a period for synchronously restarting power transmission and power reception by the TX and the RX, and can take a predetermined value.

F1014 to F1022 are processes similar to F612 to F620 (FIG. 6) of the first embodiment. Subsequently, the TX receives from the RX the second reference reception power notification that the reception power value is 13 W (F1023). The TX calculates the second reference power loss Ploss2 from the difference between the reception power value stored in the received second reference reception power notification and the transmission power value of the TX (step S911 and F1024). The TX obtains a calibration curve based on the first reference power loss Ploss1 and the second reference power loss Ploss2 (F1025). After obtaining the calibration curve, the TX transmits, to the RX, ACK serving as a response representing acknowledgement (F1026).

The TX turns on the switch 306 to stop power transmission the first period after transmitting the ACK (F1027). Similarly, the RX turns on the switch 208 to stop power reception the first period after receiving the ACK (F1028). After stopping the power transmission, the TX measures the second Q factor (step S912 and F1029). The TX turns off the switch 306 to restart power transmission the second period after the stop of power transmission (F1030). Similarly, the RX turns off the switch 208 to restart power reception the second period after the stop of power reception (F1031). The TX performs foreign object detection based on the difference between the reference second Q factor calculated in F1011 and the second Q factor calculated in F1027 (step S913 and F1032). In this example, the difference between the reference second Q factor and the second Q factor becomes equal to or larger than the threshold owing to the entrance of the foreign object. The TX determines that the foreign object exists (YES in step S914 and F1033), and transmits EPT to stop power transmission (F1034).

As described above, according to the second embodiment, the TX measures the reference second Q factor after measuring the Q factor, and performs foreign object detection based on the reference Q factor and the second Q factor measured after obtaining the calibration curve. The time interval till measurement of the reference second Q factor after measurement of the Q factor is short. If it is determined by foreign object detection based on the Q factor that no foreign object exists, the second Q factor is measured in a state in which a foreign object hardly exists. By performing foreign object detection using the reference second Q factor, even when a foreign object enters after measurement of the Q factor, the foreign object can be detected at high probability, and a safer wireless power transfer system can be implemented.

Modification

In the above-described example, the second Q factor is measured in a state in which the RX stops power reception, that is, in a state in which the switch 208 is turned on to short-circuit the power receiving coil 201 and the resonant capacitor 207. However, the second Q factor may be measured in a state in which the power receiving coil 201 and the resonant capacitor 207 are not short-circuited. In this case, a current flows into a rectification unit 202 and a voltage control unit 203 via the power receiving coil 201 and the resonant capacitor 207, and a second Q factor to be measured may be influenced depending on an operating frequency at the stop of power transmission. When foreign object detection is performed using the second Q factor in the state in which the RX is not short-circuited, second Q factors at a plurality of frequencies are desirably measured.

For example, in step S904, the second Q factors are measured at three operating frequencies of 110 kHz, 125 kHz, and 145 kHz within a frequency range of 110 kHz to 148.5 kHz, and measurement values at the three points are interpolated with respect to the frequency. For example, the TX obtains interpolated data as a reference value by linearly interpolating Q factors between three points obtained by plotting Q factors at the operating frequencies of 100 kHz, 125 kHz, and 145 kHz on a graph in which the abscissa represents the frequency and the ordinate represents the Q factor. In step S912, the TX obtains, from the interpolated data, a reference second Q factor corresponding to an operating frequency when the second Q factor is measured, and performs foreign object detection based on the measured second Q factor and the reference second Q factor obtained from the interpolated data. When the second Q factor is measured in a state in which the RX does not stop power reception, even if a foreign object enters after measurement of the Q factor, the foreign object can be detected, and a safer wireless power transfer system can be implemented.

In the second embodiment, the second Q factor is obtained under the same operating conditions (for example, power transfer at the same frequency and the same power value (voltage)) as those of the power transmitting unit 302 in steps S904 and S912. However, the present disclosure is not limited to this. For example, in step S904, the TX may obtain a plurality of second Q factors under different operating conditions, and obtain an estimation curve representing the relationship between the operating condition and the reference second Q factor. In this case, in step S913, the TX obtains, from the estimation curve generated in step S904, a reference second Q factor corresponding to an operating condition of the power transmitting unit 302 when the second Q factor was obtained in step S912. The TX determines the presence/absence of a foreign object based on the second Q factor obtained in step S912 and the reference second Q factor obtained from the estimation curve.

Although an example using the second Q factor as an index value for detecting an electrical change in the power transmitting coil 303 has been described, another measurable electrical characteristic may be used as the index value. For example, the index value may be the slope (A4–A3/T4–T3) of a voltage value between the points 804 and 805. In this case, the TX calculates not the second Q factor but the slope of the voltage value from the time and a measured voltage value in steps S904 and S912. The index value is not limited to the slope of a voltage value but, for example, the slope of a current value may be calculated, or a value (impedance, load resistance, or power) calculated from a voltage value and a current value may be used. Further, the TX may obtain a coupling coefficient representing the strength of coupling between the power transmitting coil and the power receiving coil in steps S904 and S912. Any arrangement has the same effect as the above-described one.

As described above, according to the first and second embodiments, even when a foreign object enters until the estimated value of the power loss is calculated after measurement of the Q factor, the foreign object can be detected to stop power transmission.

Other Embodiments

In the first and second embodiments, foreign object detection is performed using either of the power loss and the second Q factor as the index value of a physical amount different from the Q factor. However, both of the power loss and the second Q factor may be used. For example, the power loss and the second Q factor may be obtained after measurement of the Q factor, and foreign object detection based on the Q factor, foreign object detection (F621) based on the power loss, and foreign object detection (F1032) based on the second Q factor may be performed sequentially. The execution order of foreign object detection is not limited to this, and foreign object detection (F1032) based on the second Q factor may be performed before foreign object detection (F621) based on the power loss. By combining a plurality of foreign object detection methods, a foreign object can be detected at higher probability and a safer wireless power transfer system can be implemented.

In the first and second embodiments, when the TX detects a foreign object by foreign object detection, it stops processing (or power transmission) (steps S515 and S916). However, the present disclosure is not limited to this. For example, it is also possible that the TX performs power transmission to the RX, but suppresses the power transmission output so that the reception power value in the RX becomes small (for example, 5 W or less). When the TX receives from the RX a reception power notification including a value exceeding the reception power value=5 W, it may transmit a negative acknowledgement NAK and request the RX to suppress the reception power value to be equal to or smaller than 5 W. At this time, when the RX does not decrease the reception power value to be equal to or smaller than 5 W after that, the TX itself may reduce the power transmission output or stop power transmission. Alternatively, transmittable/receivable power may be restricted by executing again communication in the Negotiation phase between the TX and the RX and deciding again a small value (for example, 5 W or less) as the GP. In this case, power transmission/reception can continue at a proper power transmission output on the assumption that a foreign object may exist.

In the first and second embodiments, the RX can execute processing necessary to perform foreign object detection based on an index value regarding a predetermined physical amount different from the Q factor. However, when the RX cannot execute this, the TX may omit processing regarding the foreign object detection based on the index regarding the predetermined physical amount. For example, in a case in which the power loss is used as the index regarding the predetermined physical amount, the TX may omit the processing when it has not received a reception power notification (F608) from the RX during a predetermined time after detecting the placement of the RX. In this case, the TX may suppress power transfer. For example, the TX may not increase the power transmission output so that the reception power value in the RX becomes small (for example, 5 W or less). For example, the GP value decided by communication in the Negotiation phase between the TX and the RX may be set to be small (for example, 5 W or less). Even when the RX cannot execute foreign object detection using the second value different from the Q factor, power transmission/reception can continue at a proper power transmission output on the assumption that a foreign object may exist.

In the first and second embodiments, calculation or measurement for obtaining an index different from the Q factor is executed after detecting the placement of the RX, that is, in response to reception of a Signal Strength packed with respect to a Digital Ping. However, the present disclosure is not limited to this. For example, it is enough to perform the calculation or measurement till the start of processing in the Calibration phase after detecting the placement of the RX, for example, after the end of processing in the I&C phase. Regardless of the timing when the index value different from the Q factor is obtained, a foreign object can be detected at higher probability, compared to a case in which foreign object detection based on the index value is not executed. That is, according to the above-described embodiments, entrance of a foreign object until the estimated value of the power loss is calculated can be determined more accurately, increasing the reliability of foreign object detection.

According to the present disclosure, a decrease in the accuracy of foreign object detection can be suppressed.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the present disclosure is not limited to the disclosed exemplary embodiments. The scope of the following claims is to be accorded the broadest interpretation so as to encompass all such modifications and equivalent structures and functions.

The invention claimed is:
1. A power transmitting apparatus comprising:
a power transmitting unit configured to perform wireless power transfer to a power receiving apparatus;
an obtaining unit configured to obtain, from the power reception apparatus, first information on a first parameter which is measured by the power reception apparatus and second information on a second parameter;

a measuring unit configured to measure a Q factor and a third parameter;

a detecting unit configured to perform a foreign object detection based on the measured Q factor; and a determining unit configured to calculate, after the foreign object detection and before a wireless power transfer phase, a fourth parameter using the obtained first parameter and the measured third parameter, calculate a fifth parameter using the calculated fourth parameter and the obtained second parameter, and perform determination based on the calculated fifth parameter.

2. The power transmitting apparatus according to claim 1, wherein the first information is obtained from the power receiving apparatus before the foreign object detection is performed.

3. The power transmitting apparatus according to claim 1, wherein the second information is obtained from the power receiving apparatus after the foreign object detection is performed and before the wireless power transfer phase.

4. The power transmitting apparatus according to claim 1, wherein the first parameter and the second parameter represent a reception power.

5. The power transmitting apparatus according to claim 4, wherein the third parameter represents transmission a transmitted power before the foreign object detection.

6. The power transmitting apparatus according to claim 5, wherein the fourth parameter represents a power loss that is a difference between the transmitted power represented by the third parameter and a reception power represented by the first parameter.

7. The power transmitting apparatus according to claim 6, wherein the fifth parameter represents a difference between the power loss and another power loss that is a difference between a transmitted power after the foreign object detection and a reception power represented by the second parameter.

8. The power transmitting apparatus according to claim 1, wherein the determining unit determines whether a foreign object exists.

9. A method for a power transmitting apparatus the method comprising:

obtaining, from the power reception apparatus, first information on a first parameter which is measured by the power reception apparatus and second information on a second parameter;

measuring a Q factor and a third parameter;

performing a foreign object based on the measured Q factor; and calculating, after the foreign object detection and before a wireless power transfer phase, a fourth parameter using the obtained first parameter and the measured third parameter, calculating a fifth parameter using the calculated fourth parameter and the obtained second parameter, and performing determination based on the calculated fifth parameter.

10. A non-transitory computer-readable storage medium which stores a computer program for causing a computer to execute a method for a power transmitting apparatus, the method comprising:

obtaining, from the power reception apparatus, first information on a first parameter which is measured by the power reception apparatus and second information on a second parameter;

performing a foreign object based on the measured Q factor; and calculating, after the foreign object detection and before a wireless power transfer phase, a fourth parameter using the obtained first parameter and the measured third parameter, calculating a fifth parameter using the calculated fourth parameter and the obtained second parameter, and performing determination based on the calculated fifth parameter.

* * * * *